US010652987B2

(12) United States Patent
Wang et al.

(10) Patent No.: US 10,652,987 B2
(45) Date of Patent: *May 12, 2020

(54) THREE DIMENSIONAL INTEGRATED CIRCUIT ELECTROSTATIC DISCHARGE PROTECTION AND PREVENTION TEST INTERFACE

(71) Applicant: Taiwan Semiconductor Manufacturing Co., Ltd., Hsin-Chu (TW)

(72) Inventors: Mill-Jer Wang, Hsinchu (TW); Ching-Nen Peng, Hsinchu (TW); Hung-Chih Lin, Hsinchu (TW); Hao Cheng, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 167 days.

This patent is subject to a terminal disclaimer.

(21) Appl. No.: 15/882,256

(22) Filed: Jan. 29, 2018

(65) Prior Publication Data

US 2018/0153026 A1 May 31, 2018

Related U.S. Application Data

(60) Continuation of application No. 14/975,951, filed on Dec. 21, 2015, now Pat. No. 9,900,970, which is a
(Continued)

(51) Int. Cl.
*H05F 3/00* (2006.01)
*H05F 3/02* (2006.01)
(Continued)

(52) U.S. Cl.
CPC ............ *H05F 3/02* (2013.01); *G01R 1/07378* (2013.01); *G01R 1/36* (2013.01); *H02H 9/046* (2013.01);
(Continued)

(58) Field of Classification Search
None
See application file for complete search history.

(56) References Cited

U.S. PATENT DOCUMENTS

| 4,245,600 A | 1/1981 | Katada |
| 4,285,483 A | 8/1981 | Cipollone |

(Continued)

*Primary Examiner* — Stephen W Jackson
(74) *Attorney, Agent, or Firm* — Duane Morris LLP

(57) ABSTRACT

The present disclosure provides a system and method for providing electrostatic discharge protection. A probe card assembly is provided which is electrically connected to a plurality of input/output channels. The probe card assembly can be contacted with a secondary assembly having an interposer electrically connected to one or more wafers each wafer having a device under test. Voltage can be forced on ones of the plural input/output channels of the probe card assembly to slowly dissipate charges resident on the wafer to thereby provide electrostatic discharge protection. A socket assembly adaptable to accept a 3DIC package is also provided, the assembly having a loadboard assembly electrically connected to a plurality of input/output channels. Once the 3DIC package is placed within the socket assembly, voltage is forced on ones of the input/output channels to slowly dissipate charges resident on the 3DIC package to thereby provide electrostatic discharge protection.

20 Claims, 13 Drawing Sheets

Related U.S. Application Data division of application No. 13/716,272, filed on Dec. 17, 2012, now Pat. No. 9,252,593.

(51) Int. Cl.
  *H02H 9/04* (2006.01)
  *G01R 1/073* (2006.01)
  *G01R 1/36* (2006.01)
  *H05K 1/11* (2006.01)
  *H05K 1/18* (2006.01)

(52) U.S. Cl.
  CPC ............... *H05K 1/11* (2013.01); *H05K 1/181* (2013.01); *H01L 2924/15174* (2013.01); *H01L 2924/15311* (2013.01); *H05K 2201/07* (2013.01); *H05K 2201/10734* (2013.01)

(56) References Cited

U.S. PATENT DOCUMENTS

| | | |
|---|---|---|
| 4,646,009 A | 2/1987 | Mallory |
| 4,692,695 A * | 9/1987 | Poduje ............... G01R 31/2831 324/719 |
| 5,748,436 A | 5/1998 | Honme et al. |
| 6,909,297 B2 * | 6/2005 | Ji ....................... G01R 1/07342 324/754.07 |
| 7,138,812 B2 * | 11/2006 | Park ................... G01R 1/07342 324/754.07 |
| 7,750,651 B2 * | 7/2010 | Chao .................... G01R 1/0735 324/756.03 |
| 2007/0269999 A1 | 11/2007 | Di Stefano |
| 2012/0025861 A1 | 2/2012 | Park |
| 2012/0153437 A1 | 6/2012 | Chen et al. |
| 2014/0327462 A1 | 11/2014 | Jeong |

* cited by examiner

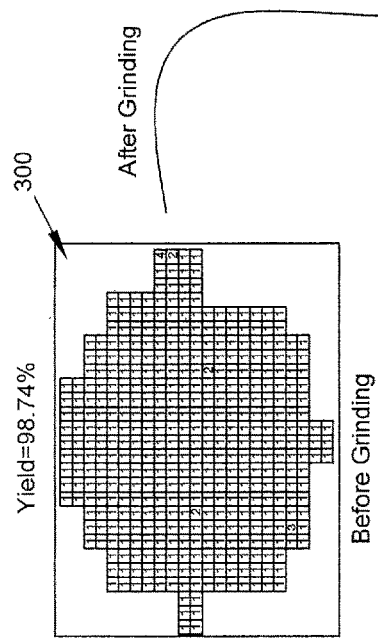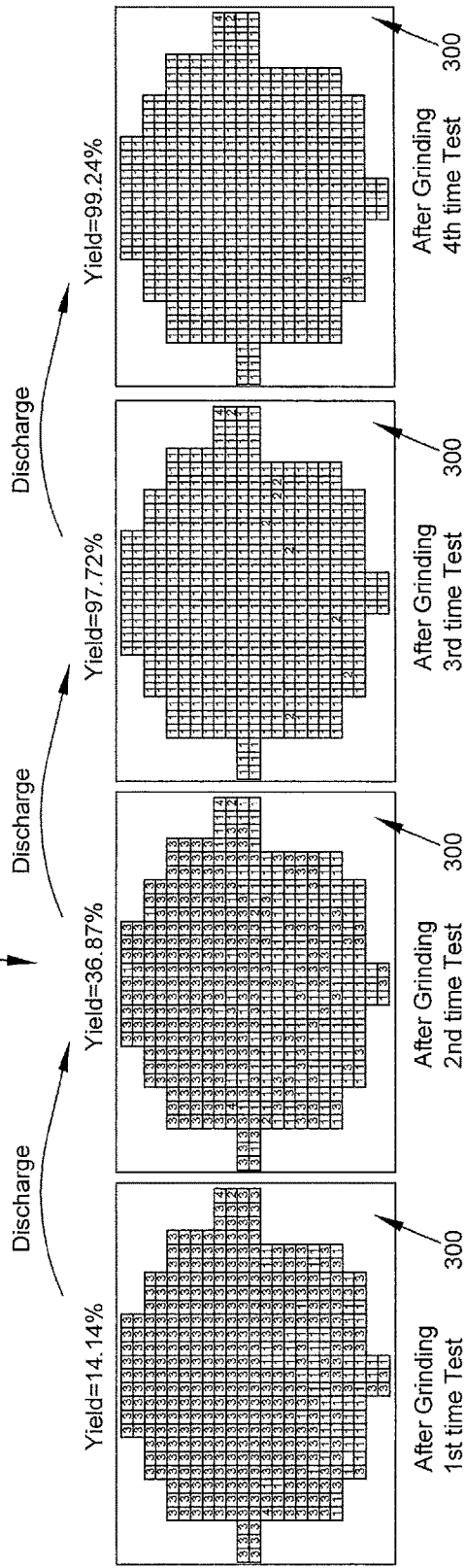

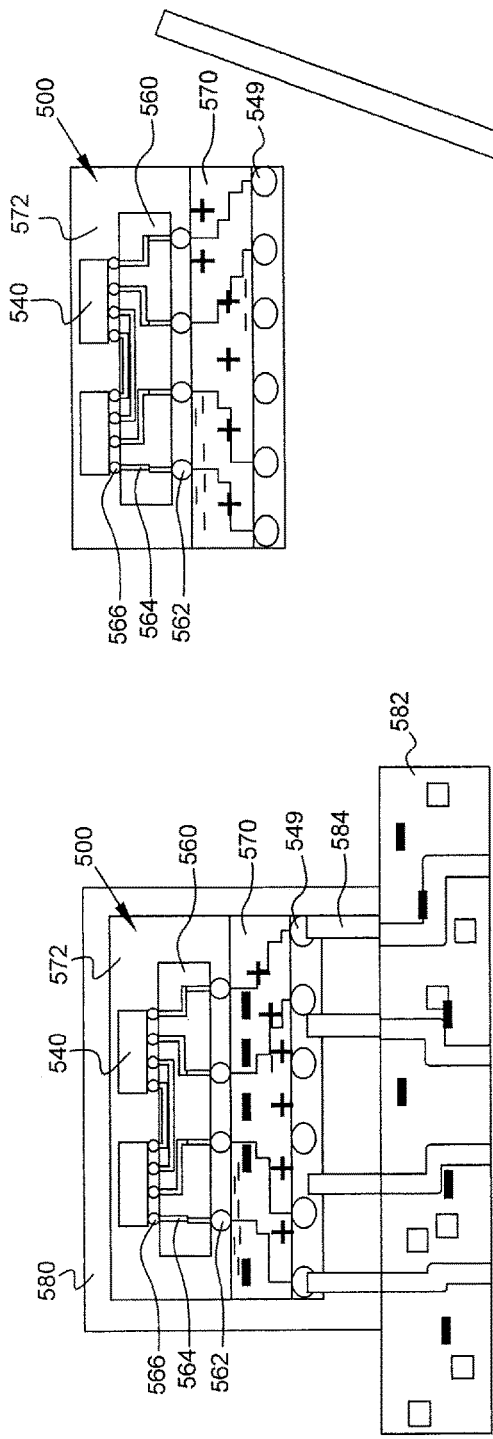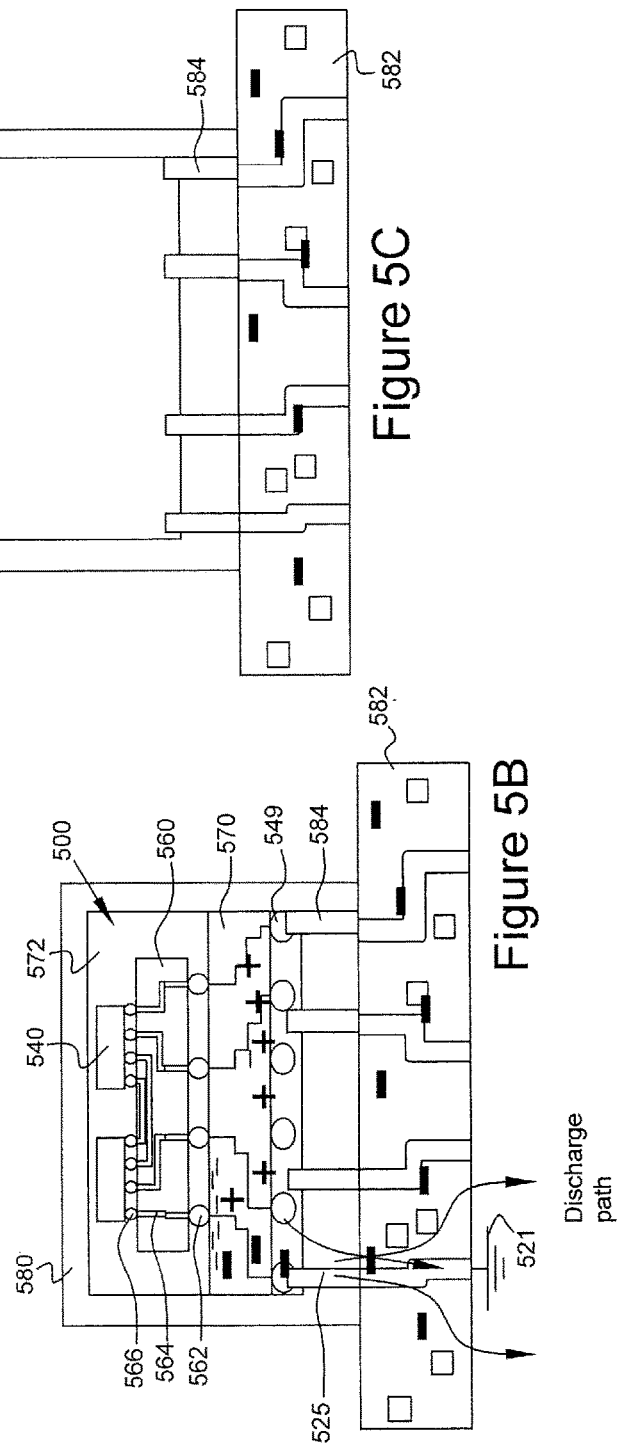

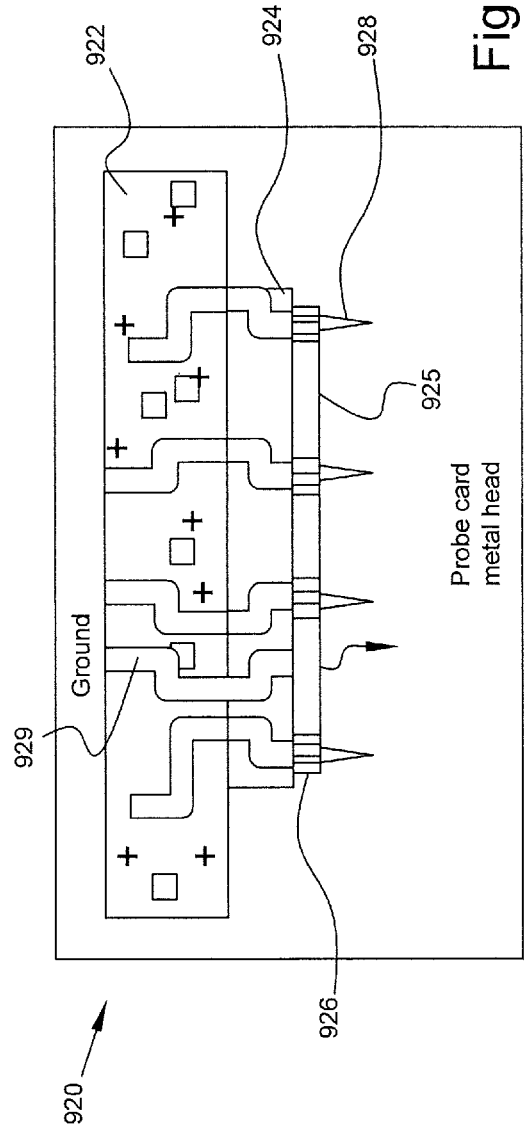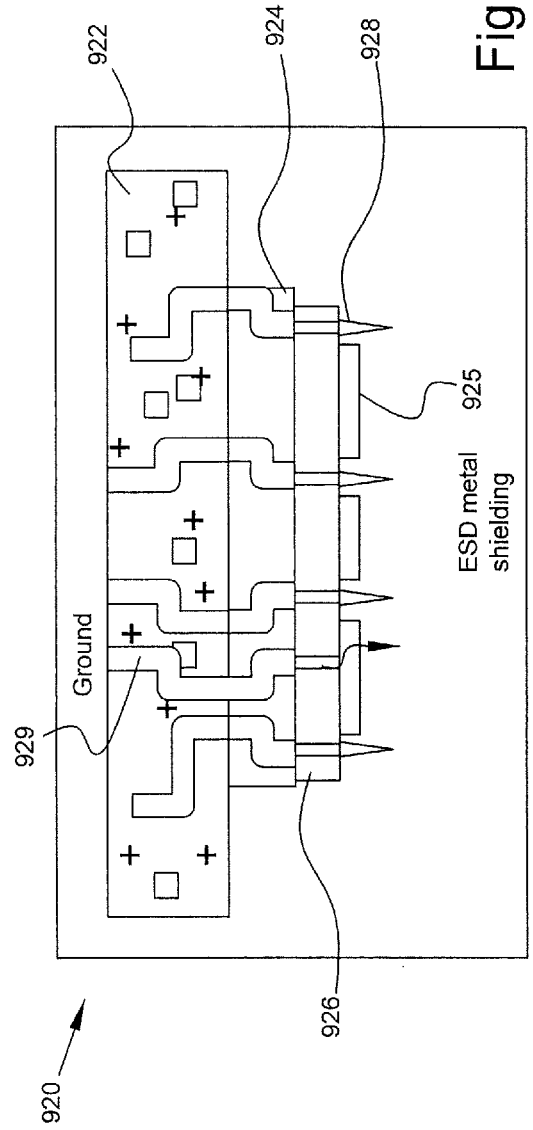

THREE DIMENSIONAL INTEGRATED CIRCUIT ELECTROSTATIC DISCHARGE PROTECTION AND PREVENTION TEST INTERFACE

This application is a continuation application of U.S. patent application Ser. No. 14/975,951, filed Dec. 21, 2015, which is a division application of U.S. patent application Ser. No. 13/716,272, filed Dec. 17, 2012, which are expressly incorporated by reference herein in their entireties.

BACKGROUND

In semiconductor integrated circuit manufacturing, integrated circuits (ICs) are conventionally tested during manufacturing and prior to shipment to ensure proper operation. Wafer testing is a testing technique commonly used in production testing of wafer-mounted semiconductor ICs where a temporary electrical connection is established between automatic test equipment (ATE) and ICs formed on the wafer to demonstrate proper performance of the ICs. Components used in wafer testing include an ATE test board, a multilayer printed circuit board connected to the ATE which transfers test signals between the ATE, and a probe card assembly. Conventional probe card assemblies include a printed circuit board, a probe head assembly having a plurality of flexible test probes attached thereto, and an interposer electrically connecting the test probes to the printed circuit board. The test probes are conventionally mounted to electrically conductive, typically metallic, bonding pads on a substrate using solder, wire bonding or wedge bonding techniques. In operation, a device under test (DUT) is moved into position so the test probes make contact with corresponding contact points on the DUT.

Along with complexity improvement of circuit designs, rapid development of semiconductor fabrication processes, and demand for circuit performance, ICs have been developed with a three-dimensional (3D) structure to increase circuit performance. Different process techniques can be used in different layers of the 3DIC, and these different chip layers or "dies" are stacked and interconnected using through silicon vias (TSVs).

As 3DICs are formed by a plurality of chip layers having varying process techniques and/or supply voltages on different chips, high-voltage static electricity or noises, commonly referred to as electrostatic discharge (ESD), can pass through the package and/or test equipment. ESD is generally defined as a sudden and momentary electric current that flows between two objects at different electrical potentials. ESD can damage devices fabricated on IC chips causing performance degradation or failures. For example, ESD can damage sensitive components in the 3DIC and test equipment including a ball grid array (BGA) package, control collapse chip connection (C4) package, flip-chip package, pin grid array (PGA) package, and other surface mount packages as well as the test interface, interposer, TSV, metal routing, ubump, gate oxide devices, and other components on the 3DIC.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIGS. 3A-3E are a series of illustrations of a wafer before a semiconductor grinding process and after subsequent discharge events on the wafer.

FIGS. 5A-5C are schematic views of how electrostatic discharge can be generated in a three dimensional integrated circuit package.

FIGS. 9A-9C are illustrations of exemplary probe card assembly embodiments.

DETAILED DESCRIPTION

Figure 1:
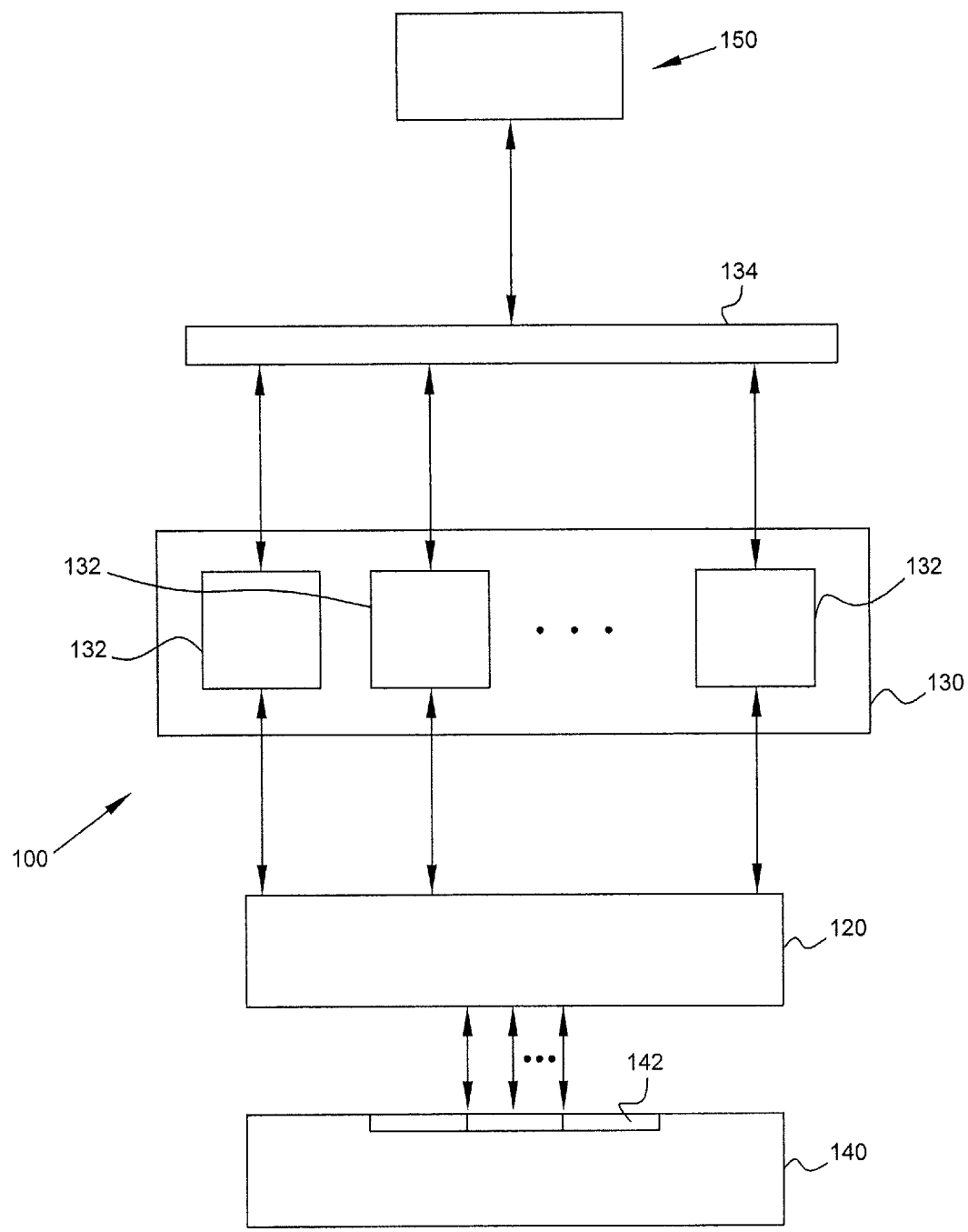
FIG. 1 is a block diagram of an integrated circuit test architecture.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below". Additionally, the terms "wafer", "chip" and "die" are used interchangeably in this disclosure and such use should not limit the scope of the claims appended herewith.

The present disclosure is generally directed to providing electrostatic discharge (ESD) protection and prevention for three dimensional integrated circuits (3DICs) and associated test equipment before and/or during testing of the 3DICs. In some embodiments, a reusable ESD dispersive dummy probe card and socket are provided to protect test equipment, devices under test (DUTs), and 3DIC packages from ESD events to expand machine life and test quality. In some embodiments, a co-designed 3DIC device and test interface are provided to afford a path for discharging static electricity on the 3DIC to protect the DUT, test instruments, and associated equipment. In some embodiments, exemplary test interfaces having metallic shielding can be employed for the prevention of induced charges on the 3DIC to thereby avoid ESD events.

Automatic Test Equipment (ATE) is widely used in the electronic manufacturing industry to test electronic components and systems after being fabricated. Typical ATE architectures include a master controller such as, but not limited to, a computer, server, etc. that communicates with and synchronizes one or more instruments. A DUT is physically connected to the ATE by another machine generally referred to as a handler or prober through a fixture that adapts the ATE's resources to the DUT. FIG. 1 is a block diagram of an exemplary IC test architecture. With reference to FIG. 1, an exemplary IC test architecture 100 includes a probe card assembly 120 for conveying signals between bond pads of a DUT 142 and the various channels 132 of a test interface assembly 130. An exemplary DUT 142 can be in the form of a die on a silicon wafer 140 that has not yet been separated from the wafer and packaged. An exemplary die typically includes a set of bond pads on its upper surface that are linked to internal circuit nodes and which act as input/output terminals. These bond pads provide points of connection for bond wires linking the circuit nodes to pins or legs of an IC package. When the die is tested before it is packaged, these bond pads are also used as points of contact for probes from a probe card assembly 120 for conveying signals between the test interface assembly 130 and the internal circuits of the DUT 142. In some embodiments, the test interface assembly 130 includes a set of channels 132 corresponding to bond pads (not shown) on the DUT 142. During a test, each channel 132 generates and transmits a digital or analog test signal input to a bond pad of the DUT 142 and/or receives and processes a digital or analog DUT output signal delivered through a bond pad. Further, before the start of a test, a host computer 150, network or other processing machine transmits instructions to each channel 132 via a bus 134. During the test, a pattern generator within the host computer 150 executes those instructions to produce a sequence of vectors (data values) providing channel instructions during successive cycles of the test.

Generally, the channels 132 are implemented on a set of printed circuit boards which can be mounted within an equipment chassis called a test head. Channels 132 can also be mounted remote from a test head but linked thereto through transmission lines. The probe card assembly 120 includes probes that contact the bond pads of the DUT 142 and that provide signal paths between the bond pads and the circuit boards in the test head implementing channels 132. While the exemplary IC test architecture 100 depicted in FIG. 1 is commonly employed, many other test architectures have been used and the claims appended herewith should not be so limited. For example, many test architectures centralize the pattern generation function of the channels 132 by providing a central pattern generator to supply data to the channels during the test. In other test architectures, channels 132 are mounted remote from the test head and connected thereto through transmission lines. Thus, the claimed subject matter is applicable to all IC test architectures.

Figure 2A:
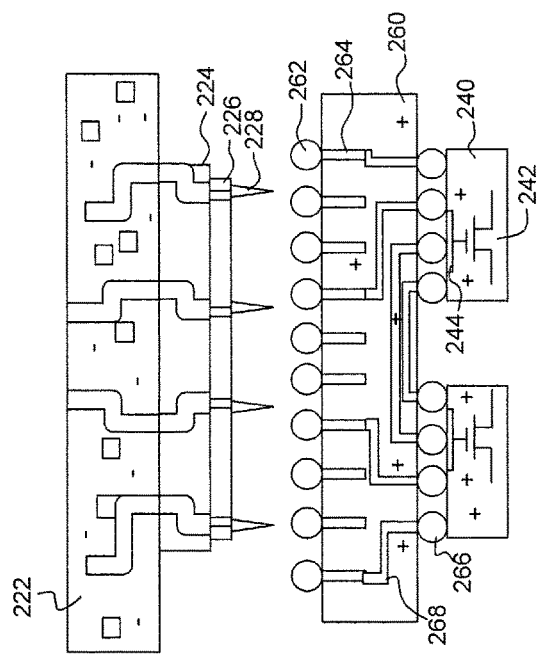
FIGS. 2A-2C are schematic views of how electrostatic discharge can be generated in a three dimensional integrated circuit testing environment.
Figure 2B:
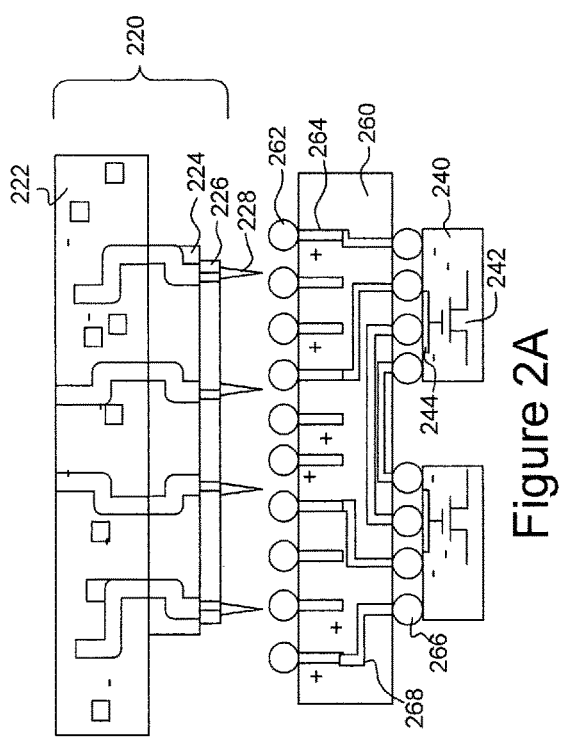
Figure 2C:
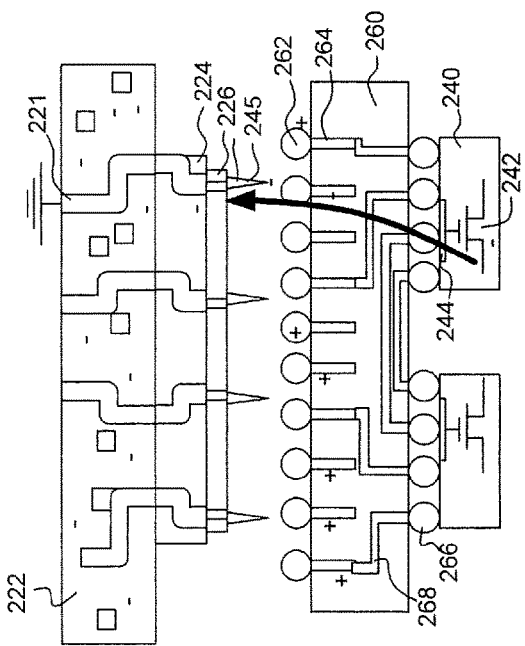

FIGS. 2A-2C are schematic views of how ESD can be generated in a 3DIC testing environment. With reference to FIGS. 2A-2C, there are many different processes required to manufacture a 3DIC including, but not limited to, grinding, etching, milling, various deposition techniques, and the like. These processes can generate charges on the manufactured devices. For example, during an exemplary IC test procedure, an exemplary probe card or probe card assembly 220 can be used as described above to perform testing on a DUT 242 on a die 240 or wafer. A probe card is generally an interface between an electric test system and a semiconductor wafer having a variety of circuits or devices (DUTs) thereon to be tested. The probe card is used to provide an electrical path between a respective testing system and these DUTs to permit validation of the DUTs before they are diced and packaged. In some embodiments, the probe card 220 includes a probe card printed circuit board (PCB) 222, probe card substrate 224, probe card head 226 and probe needles 228. Of course, other probe cards 220 can be used in embodiments of the present subject matter and the claims appended herewith should not be so limited. For example, exemplary probe cards are generally classified into needle type, vertical type and Micro Electro-Mechanical System (MEMS) type depending upon the shape and form of contact elements. Thus, while many figures herein illustrate a needle type probe card, embodiments of the present subject matter are not limited to these types of probe cards. With continued reference to FIGS. 2A-2C, bonding or probe pads 244 are included on the die 240 to provide electric contact points with an adjacent interposer 260. An interposer 260 is generally an electrical interface routing between one connection to another to spread a connection to a wider pitch and/or reroute connections. The interposer 260 depicted in FIGS. 2A-2C can include control collapse chip connection (C4) bumps 262 connected to through silicon vias (TSVs) 264 and microbumps 266 to provide a connection path from the probe card 220 to the DUTs 242. In some embodiments, the interposer 260 can also include metal routing connectors 268 to provide additional connective circuitry between the DUTs 242 and probe card 220.

With reference to FIG. 2A, negative charges can exist on the probe card PCB 222 due to its insulator components. As a result of these negative charges, positive charges and negative charges can be induced on two sides of the interposer possibly damaging components thereon. With reference to FIG. 2B, negative charges can exist on the probe card PCB 222. During testing of the DUTs 242, an ESD event can be induced from the PCB ground 221 through a respective ground pin 245 or needle of the probe card 220 and through the interposer 260 thereby discharging through the DUTs 242 resulting in damage to components on the DUTs 242 and/or the interposer 260. With reference to FIG. 2C, due to negative charges that can exist on the probe card PCB 222, positive charges can be induced on the wafer side on the DUTs 242 possibly damaging components thereon and/or leading to an ESD event. By way of example, FIGS. 3A-3E are a series of illustrations of a wafer before a semiconductor grinding process and after subsequent discharge events on the wafer. With reference to FIG. 3A, a wafer 300 is illustrated having a high yield of 98.74 percent with little charge on the surface of the wafer 300. After undergoing a grinding process, the wafer 300 suffers a high yield loss down to 14.14 percent as evidenced by the large amount of charge induced on the wafer surface illustrated in FIG. 3B. After subsequent discharge events illustrated in FIGS. 3C, 3D and 3E the yield of the wafer 300 increases from 36.87 percent to 97.72 percent and to 99.24 percent, respectively.

Figure 4:
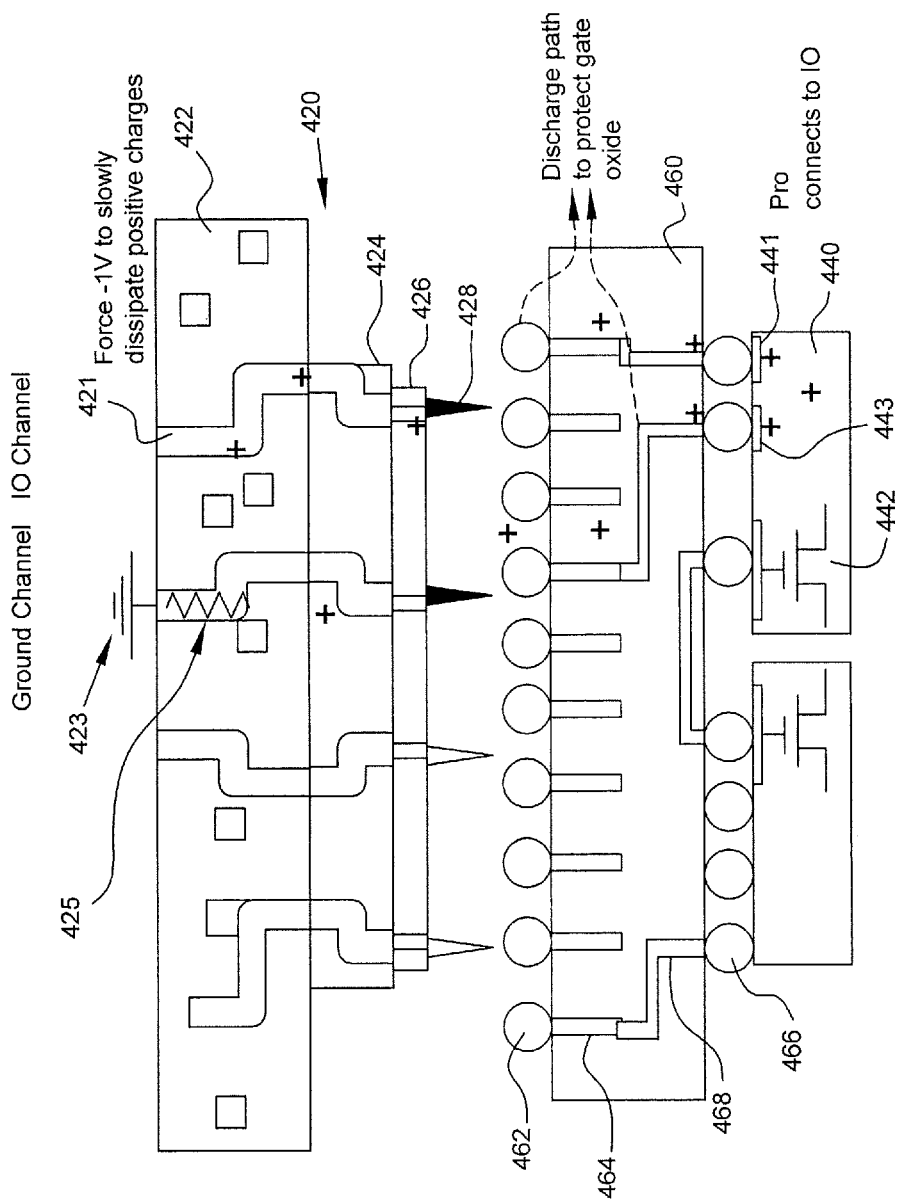
FIG. 4 is a schematic diagram of an exemplary discharge process according to an embodiment of the present subject matter.

To prevent the deleterious effects of ESD, some embodiments include a parametric measurement unit (PMU) discharge process before performing any applicable 3DIC testing. A PMU is a computer controlled instrument to source or measure a wide range of parameters during IC testing. Other typical ATE instruments include digital power supplies, waveform generators, digitizers, digital I/Os, and utility supplies. These instruments perform different measurements on a DUT and are generally synchronized so that they source and measure waveforms at the proper times. Typically, PMU channels are shared among a number of DUT channels and provide forcing and measuring functions for the respective DUTs, but digitizing is generally required external to the PMU. One exemplary PMU discharge process can include programming all I/O pin levels to 1 V at a waiting time of 400 ms and then to −1 V at a waiting time of 400 ms to provide adequate discharge of static electricity on the DUT. FIG. 4 is a schematic diagram of an exemplary discharge system and process in accordance with various embodiments of the present disclosure. With reference to FIG. 4, it is illustrated that charges or static electricity on a wafer can be slowly discharged through probe pads connected to an I/O circuit and through voltage-forced tester channels. These charges on the wafer can be slowly discharged through probe pads connected to a ground bus or power bus and then through exemplary tester channels.

Before employing an exemplary IC test procedure, a probe card or probe card assembly 420 can be used to provide an electrical path between a respective testing system and DUTs 442 to permit validation of the DUTs 442 before they are diced and packaged. In some embodiments, the probe card 420 includes a probe card PCB 422, probe card substrate 424, probe card head 426 and probe needles 428. Of course, other probe cards 420 can be used in embodiments of the present subject matter such as, but not limited to, vertical type and MEMS type probe cards. Probe pads 441 are included on the die 440 to provide electric contact points with an adjacent interposer 460. The interposer 460 includes C4 bumps 462 connected to TSVs 464 and microbumps 466 to provide a connection path from the probe card 420 to the DUTs 442. In some embodiments, the interposer 460 can also include metal routing connectors 468 to provide additional connective circuitry between the DUTs 442 and probe card 420. In some embodiments, an exemplary PMU (not shown) can force positive or negative voltage on a respective I/O channel 421 to slowly dissipate negative or positive charges, respectively on the die 440 using a probe pad 441 thereon. In some embodiments, the die 440 includes another probe pad(s) 443 connecting a ground bus or power bus to the corresponding tester ground channel 423 or power channel. In some embodiments, a large resistance 425 is included in any one of these tester channels to slowly dissipate any charges on the wafer to ground.

FIGS. 5A-5C are schematic views of how ESD can be generated in a 3DIC package. With reference to FIGS. 5A-5C, there are many packaging processes and materials for 3DICs that can generate charges on 3DIC packages. With reference to FIGS. 5A-5C, an exemplary 3DIC package 500 includes one or more dies 540 encased in a mold 572. The dies 540 can be connected to an interposer 560 via microbumps 566 to provide a connection from the dies 540 to a ball grid array (BGA) 549. The interposer 560 depicted in FIGS. 5A-5C can also include C4 bumps 562 connected to TSVs 564 and microbumps 566 to provide the connection path from the BGA 549 to the dies 540. Positioned between the C4 bumps 562 and BGA 549 is a substrate 570. During testing procedures of the package 500, the package 500 can be placed in a socket 580 whereby testing of the circuitry and/or components in the package 500 occurs using a loadboard PCB 582 via pogo pins 584.

With reference to FIG. 5A, negative charges can exist on the loadboard PCB 582. As a result of these negative charges, positive and negative charges can be induced on the substrate and package possibly damaging components thereon. With reference to FIG. 5B, negative charges can exist on the loadboard PCB 582, and negative charges can exist on the substrate 570. During testing of the package 500, an ESD event can be induced from the PCB ground 521 through a respective ground pin 525 and through the package 500 resulting in damage to components thereon. With reference to FIG. 5C, due to negative charges that can exist on the loadboard PCB 582, positive charges can be induced on the substrate side on the package 500 possibly damaging components thereon and/or leading to an ESD event.

Figure 6:
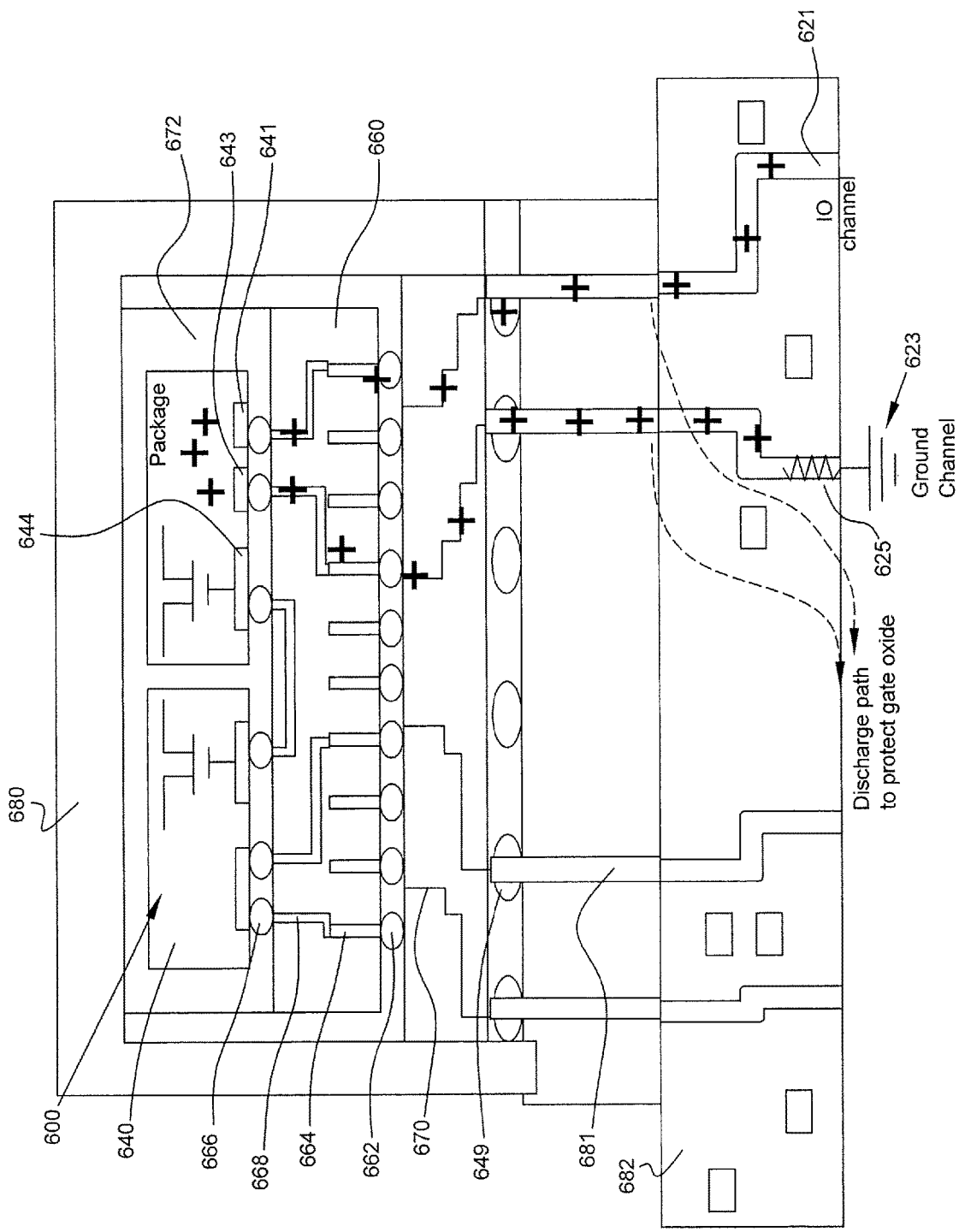
FIG. 6 is a schematic diagram of an exemplary discharge process according to an embodiment of the present subject matter.

FIG. 6 is a schematic diagram of an exemplary discharge process according to an embodiment of the present subject matter. With reference to FIG. 6, it is illustrated that charges or static electricity on a 3DIC package can be slowly discharged through probe pads connecting to an I/O circuit and through voltage-forced tester channels. These charges on the 3DIC package can be slowly discharged through probe pads connecting to a ground bus or power bus and then through exemplary tester channels.

Before employing an exemplary IC test procedure, a socket assembly 680 can be used to provide an electrical path between a respective testing system and devices to be protected on a die. In some embodiments, an exemplary 3DIC package 600 includes one or more dies 640 having devices thereon to be protected. Exemplary devices include, but are not limited to, diode based devices, resistive-capacitive based devices, transistor based devices, silicon-controller rectifiers, PNP transistors, NPN transistors, n-channel metal-oxide-semiconductor (NMOS) transistors, p-channel metal-oxide-semiconductor (PMOS) transistors, field oxide devices, gate triggered devices, base triggered devices, substrate triggered devices, zener diodes, metal oxide varistors, transient voltage suppression diodes, complementary metal oxide semiconductors (CMOSs), bipolar clamp diodes, and combinations thereof. Probe pads 644 are included on the die 640 to provide electric contact points with an adjacent interposer 660 via microbumps 666. The probe pads 644, die 640 and components thereon are encased in a mold 672. The interposer 660 includes C4 bumps 662 connected to TSVs 664 to provide a connection path from the devices on the die 640 to a substrate 670 adjacent the C4 bumps 662. In some embodiments, the interposer 660 can also include metal routing connectors 668 to provide additional connective circuitry between the devices on the die 640 and the substrate 670. Positioned on an opposing side of the substrate 670 from the C4 bumps 662 is a BGA 649 used to mount the package 600 within the socket 680 and to provide interconnection pins 681 between the substrate 670 and loadboard PCB 682. In some embodiments, exemplary circuitry such as, but not limited to, PMUs, digital power supplies, analysis logic, control logic, clock logic and other circuitry can force positive or negative voltage on an I/O channel 621 to slowly dissipate negative or positive charges, respectively, on the die 640 using a probe pad 641 thereon. In some embodiments, the die 640 includes another probe pad(s) 643 connecting a ground bus or power bus to the corresponding tester ground channel 623 or power channel. In some embodiments, a large resistance 625 is included in any one of these tester channels to slowly dissipate any charges on the package 600 to ground. Thus, an acceptable discharge path can be established to protect sensitive devices in the package 600, the devices including gate oxide devices and the like.

Figure 7:
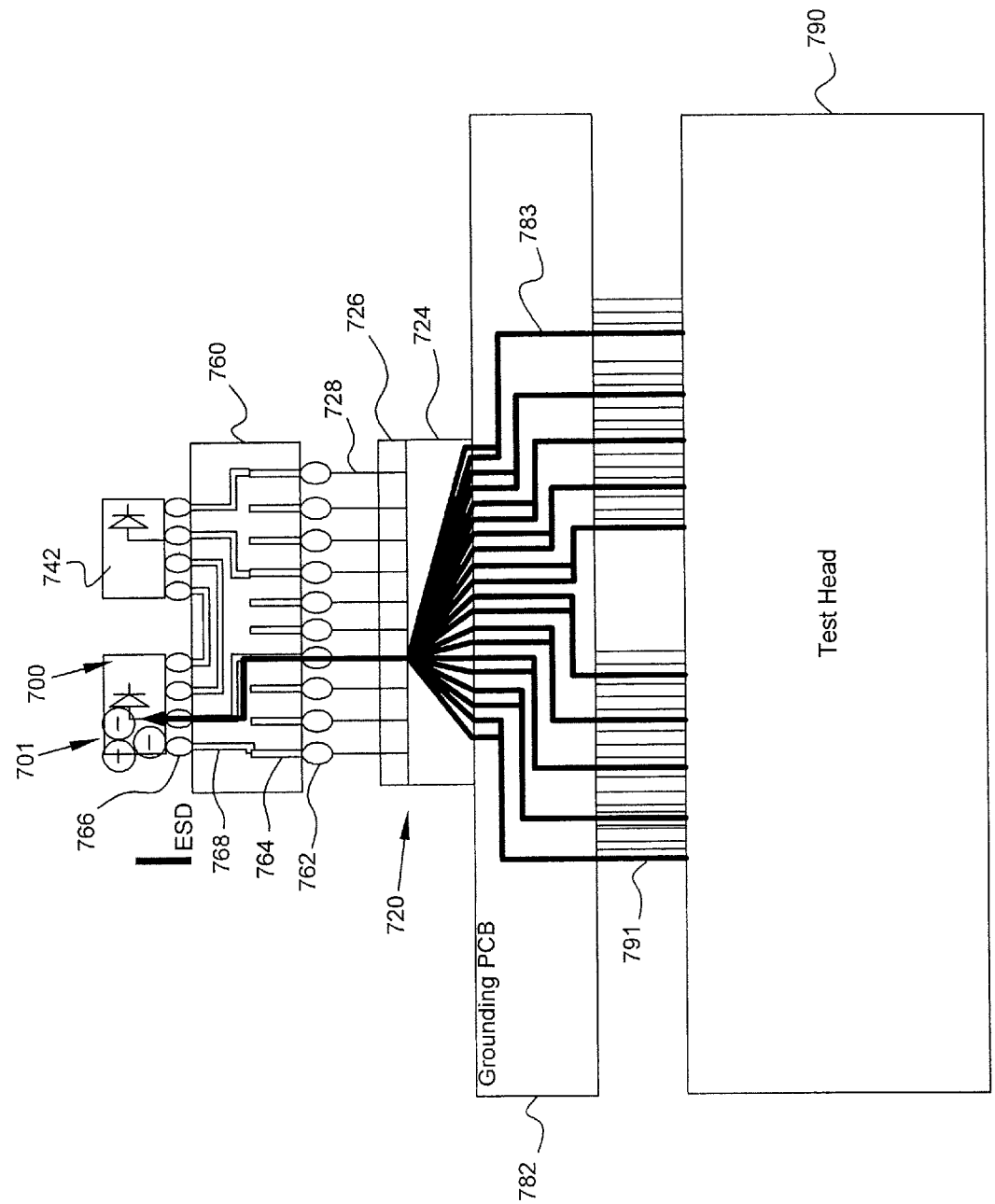
FIG. 7 is a schematic diagram of an exemplary discharge process according to another embodiment of the present subject matter.

In some embodiments, a dummy, reusable probe card assembly can be employed to discharge static electricity on a wafer. FIG. 7 is a schematic diagram of an exemplary discharge process in accordance with various embodiments of the present disclosure. With reference to FIG. 7, it is illustrated that charges 701 or static electricity on a wafer 700 can be dispersed through a conductive substrate to reduce heat and/or current that is typically generated in a narrow path during an ESD event. For example, before employing an exemplary IC test procedure, a probe card or probe card assembly 720 can be used to provide an electrical path between a respective testing system or test head 790 and DUTs 742 to permit validation of the DUTs 742 before they are diced and packaged. In the depicted embodiment, the probe card 720 includes a conductive substrate 724, probe card head 726 and probe needles 728. Of course, other probe cards 720 can be used in embodiments of the present subject matter such as, but not limited to, vertical type and MEMS type probe cards. Thus, the probe card head 726 can be any type of probe card head without regard to the design of the underlying conductive substrate 724 and is usually determined by chip bump and pad location. While not shown, probe pads can be included on the die 742 to provide electric contact points with an adjacent interposer 760. The interposer 760 includes C4 bumps 762 connected to TSVs 764 and microbumps 766 to provide a connection path from the probe card 720 to the DUTs 742. In some embodiments, the interposer 760 can also include metal routing connectors 768 to provide additional connective circuitry between the DUTs 742 and probe card 720. Positioned on an opposing side of the conductive substrate 724 from the probe card head 726 is a grounding PCB 782 which provides electrical routing from the conductive substrate 724 to tester or test head ground channels 783 to thereby short all signal traces to ground traces via ground pins 791 and effectively disperse an ESD event. The conductive substrate 724 can comprise any suitable metallic material that can be used to divert ESD current or charges from the DUTs 742 and disperse this to any number of or all I/O ground channels thereby reducing the amount of heat generated by the ESD event and preventing damage to sensitive components on the interposer 760 and/or DUTs 742. It should be noted that the substrate 724 can be reused for a variety of probe card heads 726 and ESD protection processes. Additionally, the grounding PCB 782 can assist the conductive substrate 724 in dispersing and diverting the ESD event to the ground channels and pins 791 to lower the possibility of damaging the test head 790. Thus, an exemplary method of discharging static electricity on a 3DIC includes constructing an appropriate probe card assembly having a conductive substrate, probe card head, and probe needles and then discharging any static charges resident on the 3DIC through contact with a grounding structure depicted in FIG. 7.

Figure 8:
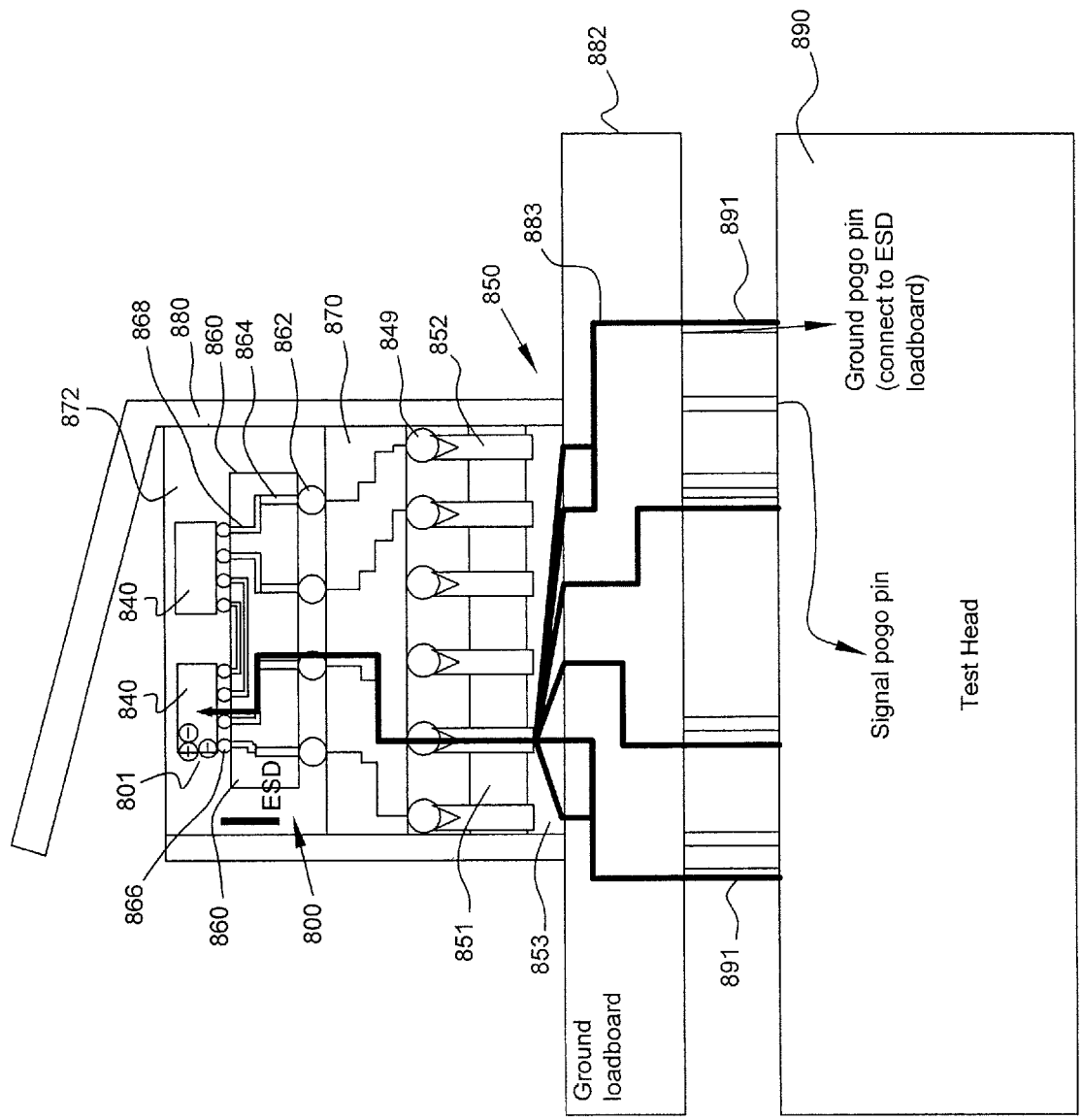
FIG. 8 is a schematic diagram of an exemplary discharge process according to another embodiment of the present subject matter.

In some embodiments, a dummy, reusable socket can be employed to discharge static electricity on a 3DIC package. FIG. 8 is a schematic diagram of an exemplary discharge process in accordance with various embodiments of the present disclosure. With reference to FIG. 8, it is illustrated that charges 801 or static electricity on a wafer, chip or die 840 can be dispersed through a conductive substrate to reduce heat and/or current generated in a narrow path. For example, before employing an exemplary IC test procedure, a socket assembly 880 having a closable lid can be used to provide an electrical path between a respective testing system or test head 890 and devices to be protected on a die. In the depicted embodiment, an exemplary 3DIC package 800 includes one or more dies 840 having devices thereon to be protected. Exemplary devices include, but are not limited to, diode based devices, RC based devices, transistor based devices, silicon-controller rectifiers, PNP transistors, NPN transistors, NMOS transistors, PMOS transistors, field oxide devices, gate triggered devices, base triggered devices, substrate triggered devices, zener diodes, metal oxide varistors, transient voltage suppression diodes, complementary metal oxide semiconductors (CMOSs), bipolar clamp diodes, and combinations thereof. Probe pads (not shown) can be included on the die 840 to provide electric contact points with an adjacent interposer 860 via microbumps 866. The probe pads, die 840 and components thereon are encased in a mold 872. The interposer 860 includes C4 bumps 862 connected to TSVs 864 to provide a connection path from the devices on the die 840 to a substrate 870 adjacent the C4 bumps 862. In some embodiments, the interposer 860 can also include metal routing connectors 868 to provide additional connective circuitry between the devices on the die 840 and the substrate 870. Positioned on an opposing side of the substrate 870 from the C4 bumps 862 is a socket assembly 850 including a socket base 851, socket or pogo pins 852, and a conductive plate 853. A loadboard assembly 850 is used to mount the substrate 870, interposer 860 and package 800 within the socket 880 and provide stability for pogo pins 852 between the substrate 870 and the conductive plate 853. The socket base 851 can be any type of base without regard to the design of the underlying conductive plate 853 and is usually determined by package type to hold the respective pins 852. Positioned on an opposing side of the conductive plate 853 from the BGA 849 is a grounding loadboard PCB 882 which provides electrical routing from the conductive plate 853 to tester or test head ground channels 883 to short all signal traces to ground traces via ground pins 891 thereby effectively dispersing an ESD event. The conductive plate 853 can comprise any suitable metallic material that can be used to divert ESD current or charges from the dies 842 and disperse this to any number or all I/O ground channels to thereby reduce the amount of heat generated by the ESD event and prevent damage to sensitive components on the interposer 860 and/or dies 842. It should be noted that the socket base 851 and respective pins 852 can be any type of base, and the plate 853 can be reused for a variety of bases and ESD protection processes. Additionally, the grounding loadboard PCB 882 can assist the conductive plate 853 in dispersing and diverting an ESD event to the ground channels and pins 891 to lower the possibility of damaging the test head 890. Thus, an exemplary method of discharging static electricity on a 3DIC package includes constructing an appropriate loadboard assembly having a grounding loadboard, conductive plate, pogo pins and socket base and then discharging any static charges resident on the 3DIC package through contact with the loadboard assembly and grounding structure depicted in FIG. 8.

Figure 9A:
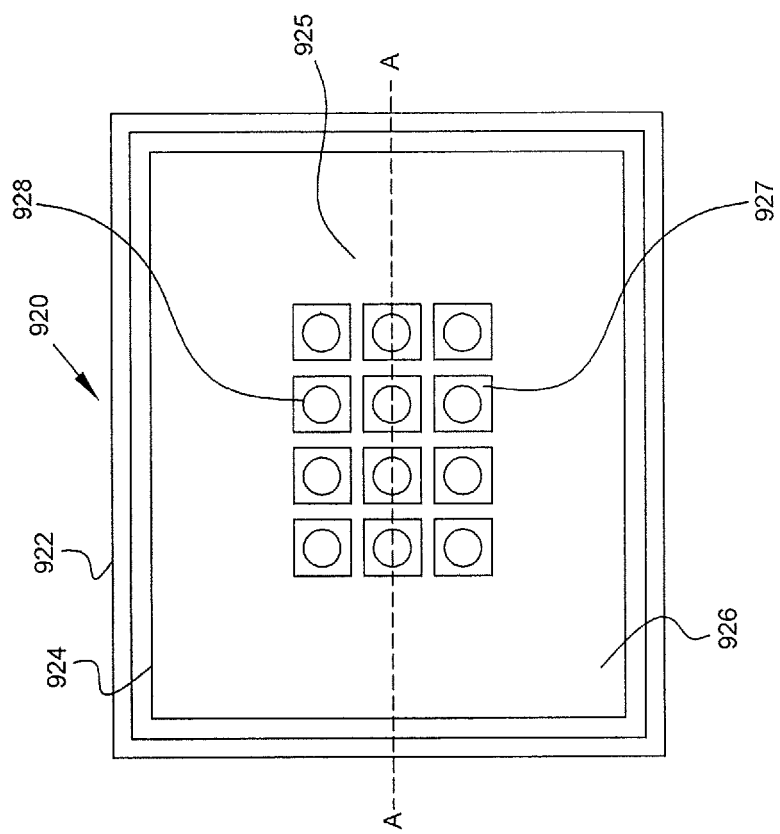

FIGS. 9A-9C are illustrations of exemplary probe card assemblies in accordance with various embodiments of the present disclosure. More specifically, FIG. 9A is a planar view of the bottom of an exemplary probe card assembly. FIG. 9B is a cross-sectional view of the probe card of FIG. 9A along line A-A. FIG. 9C is a cross-sectional view of another exemplary probe card assembly. With reference to FIGS. 9A-9C, a probe card or probe card assembly 920 can be used to provide an electrical path between a respective testing system and DUTs (not shown) to permit validation of the DUTs before they are diced and packaged. In some embodiments, the probe card 920 includes a probe card PCB 922, probe card substrate 924, probe card head 926 and probe needles 928. Of course, other probe cards types can be used in embodiments of the present subject matter such as, but not limited to, vertical type and MEMS type probe cards. In the depicted embodiments, portions 925 of the probe card head 926 are comprised of a conductive metal to shield a wafer or chip to be tested from the probe card PCB 922 to avoid inducing charges on the wafer or chip. Further, the conductive head 926 is connected to a ground channel 929 in the probe card PCB 922. Conductive metal in the head 926 can be any type of conductive material including, but not limited to, nickel alloys, copper alloys, aluminum, copper or any other metals or alloys. The probe needles 928 can also be insulated from the conductive metal portions 925 using insulation sections 927 by a variety of means. For example, FIG. 9B provides an illustration of a metallic or conductive probe card head having insulative sections between the probe needles and card head whereas FIG. 9C provides an illustration of an insulative probe card head having a metallic layer thereon. Thus, in the probe card assemblies depicted in FIGS. 9A-9C, with the exemplary conductive probe card head connected to a ground channel, any induced positive or negative charges in the assembly should not induce charges on DUTs by shielding effect of the metal layer on probe card head thereby preventing any damage to components on the DUT during ESD events.

Figure 10B:
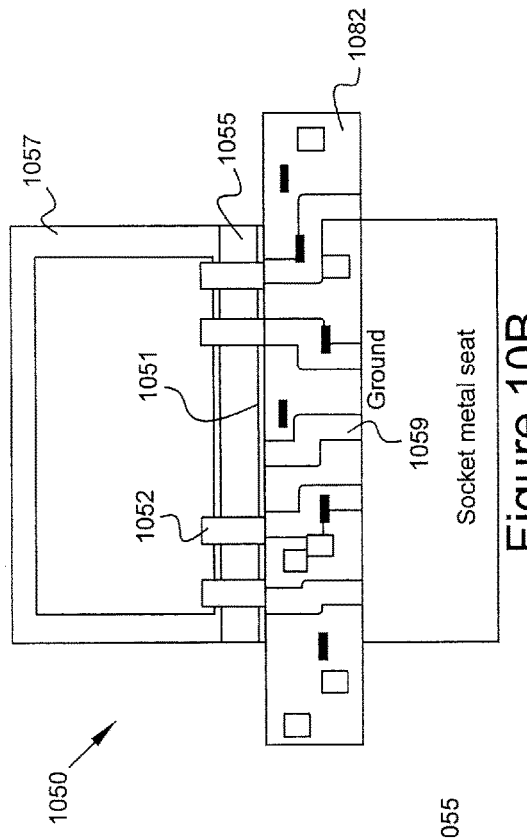
FIGS. 10A-10C are illustrations of exemplary socket assembly embodiments.
Figure 10C:
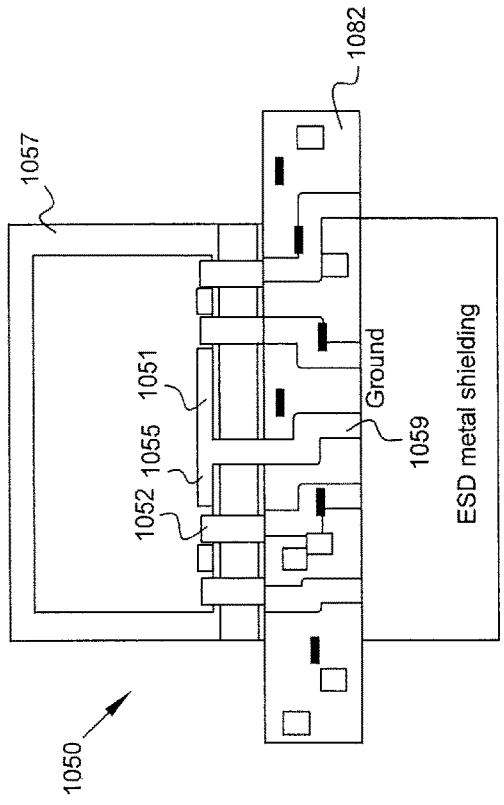
Figure 10A:
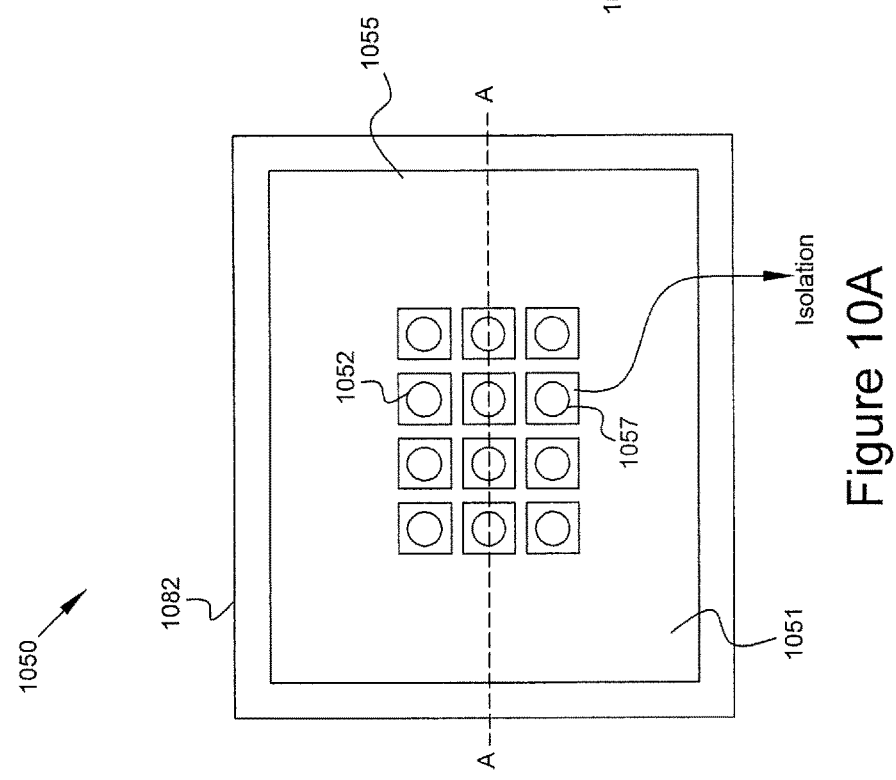

FIGS. 10A-10C are illustrations of exemplary socket assemblies in accordance with various embodiments of the present disclosure. More specifically, FIG. 10A is a planar view of the top of an exemplary loadboard PCB assembly. FIG. 10B is a cross-sectional view of a socket and loadboard assembly of FIG. 10A along line A-A. FIG. 10C is a cross-sectional view of another exemplary socket and loadboard assembly. With reference to FIGS. 10A-10C, a socket and loadboard assembly 1050 can be used to provide an electrical path between a respective testing system and 3DIC package (not shown) to permit validation of the package. In some embodiments, the socket and loadboard assembly 1050 includes a socket case 1057 having a closable lid and conductive socket base 1051 having socket or pogo pins 1052 therethrough to shield a 3DIC package to be tested from a loadboard PCB 1082 thereby avoiding an inducement of charges on the package. Further, the conductive base 1051 is connected to a ground channel 1059 in the loadboard PCB 1082. The conductive material for the socket base 1051 can be any type of conductive material including, but not limited to, nickel alloys, copper alloys, aluminum, copper or any other metals or alloys. The conductive socket base 1051 can be any type of base and is usually determined by the 3DIC package type to hold the respective pins 1052. Positioned adjacent the conductive base and generally on an opposing side from BGAs (not shown) within the confines of the case 1057 is the loadboard PCB 1082 which provides electrical routing from the conductive socket base 1051 to tester or test head. The pogo pins 1052 can also be insulated from the conductive metal portions 1055 of the base 1051 by insulation sections 1057 in a variety of means. For example, FIGS. 10A and 10B provide an illustration of a conductive socket base having insulative sections between the pogo pins and base whereas FIG. 10C provides an illustration of an insulative socket base having a metallic layer thereon. Thus, in the socket assemblies depicted in FIGS. 10A-10C, with the conductive base connected to a ground channel, any induced positive or negative charges in the assembly should not induce charges on DUTs by shielding effect of the metal layer on socket base thereby preventing any damage to components in the package and/or assembly during ESD events.

Some embodiments of the present subject matter provide an exemplary ESD protection test method having a chip and test interface design whereby a reusable test interface can be used to enhance ESD protection. For example, an exemplary wafer can be designed having the probe pads described above to dissipate charges. During testing design, high resistance channels and shielding on the probe card can be designed to dissipate or divert an ESD event. For example, shielding metals in the form of a conductive substrate, etc. can be designed on the probe card to prevent formation of an ESD event. During packaging processes, an ESD discharge ground channel can be designed on the respective socket, and shielding metals can also be designed on the socket to prevent formation of an ESD event. After this testing design phase, the wafer can be manufactured by various processes, and after such manufacturing, a reusable dummy probe card as described above can be employed to discharge static electricity resident on the wafer. If the dummy probe card is employed, then the actual probe card should be subsequently substituted back into the process. In such a discharge process, charges or static electricity on a wafer can be slowly discharged through probe pads connected to an I/O circuit and through voltage-forced tester channels. After this wafer level testing, a packaging testing process can be employed using, in some embodiments, a dummy socket to discharge static electricity resident on the package. If the dummy socket is employed, then the actual socket should be subsequently substituted back into the process. In such a discharge process, charges or static electricity on a package can be discharged through voltage-forced tester channels.

Figure 11:
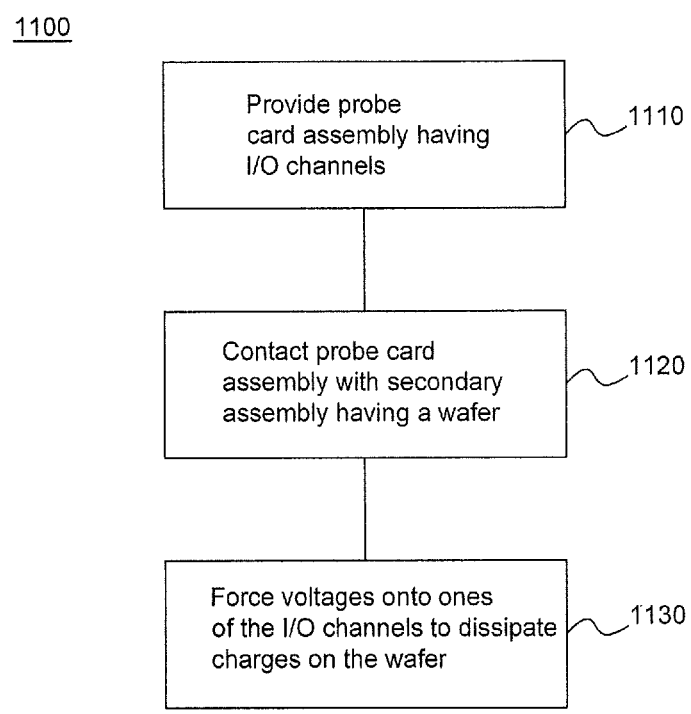
FIG. 11 is a block diagram of one embodiment of the present subject matter.

FIG. 11 is a block diagram of a method 1100 in accordance with various embodiments of the present disclosure. With reference to FIG. 11, the method 1100 of providing ESD protection includes at step 1110, providing a probe card assembly electrically connected to a plurality of input/output channels. At step 1120, the probe card assembly can be contacted with a secondary assembly, the secondary assembly having an interposer electrically connected to one or more wafers, each wafer having a device under test. In some embodiments, step 1120 includes contacting ones of a plurality of probe card pins in the probe card assembly to probe pads on the one or more wafers to connect to the wafer to an input/output ground or power channel having a high resistance to dissipate charges on the wafer.

At step 1130, voltage is forced on ones of the plural input/output channels of the probe card assembly to slowly dissipate charges resident on the wafer to thereby provide electrostatic discharge protection. In some embodiments, the forced voltage is positive and the dissipated charges are negative. In some embodiments, the forced voltage is negative and the dissipated charges are positive. In some embodiments, steps 1110 through 1130 are performed before testing of the wafer. In some embodiments, step 1130 includes programming levels of ones of the plurality of input/output channels to 1 V at a waiting time of 400 ms and then to −1 V at a waiting time of 400 ms to dissipate charges on the wafer.

In some embodiments of the present subject matter, a system to avoid ESD to a wafer can include a probe card assembly electrically connected to a plurality of input/output channels. This probe card assembly can comprise a probe card PCB, a probe card substrate adjacent the probe card PCB, a probe card head adjacent the probe card substrate and opposite the PCB, and a plurality of probe card pins connected to the probe card head. The system further comprises a secondary assembly having an interposer electrically connected to one or more wafers, each wafer having a device under test. When the probe card pins contact probe pads on the wafer, voltage is forced on ones of the plurality of input/output channels to slowly dissipate charges resident on the wafer to provide electrostatic discharge protection. This forced channel can be a ground channel having a high resistance or a power channel having a high resistance. In some embodiments, the secondary assembly further comprises an array of control collapse chip connection bumps connected to respective through silicon vias which are electrically connected to an array of ubumps, the ubumps adaptable to provide an electrical connection between the probe card assembly and the devices under test. In some embodiments, the probe card head further includes a metal layer thereon for shielding the wafer from charges on the probe card PCB thereby avoiding inducement of charges on the wafer. This probe card head may also provide insulative portions between the plurality of probe pins and the metal layer to provide a shielding effect between the probe card assembly and the wafer.

Figure 12:
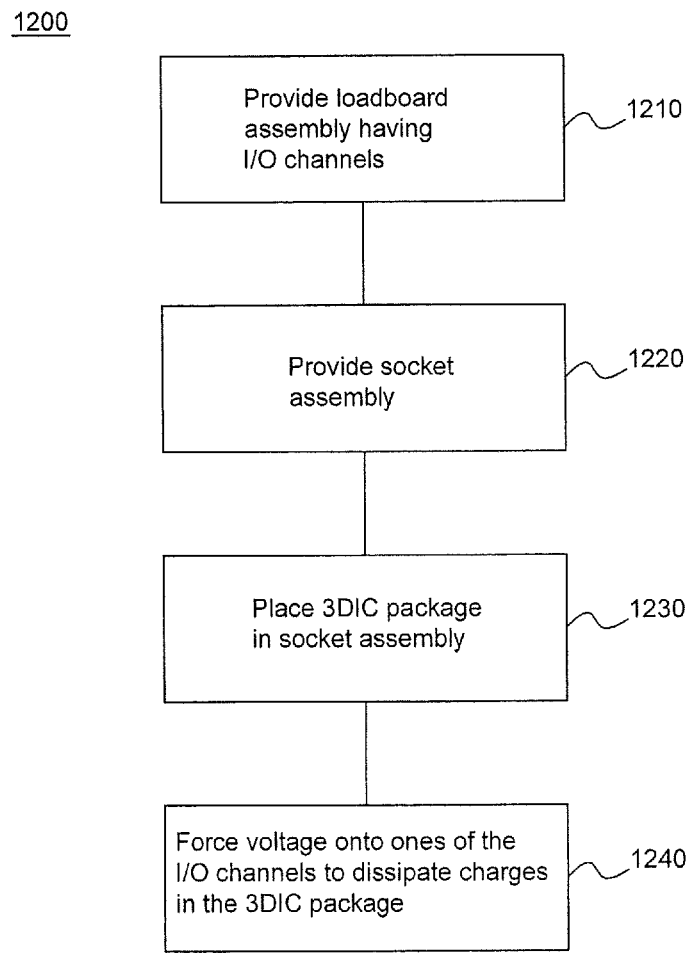
FIG. 12 is a block diagram of another embodiment of the present subject matter.

FIG. 12 is a block diagram of a method 1200 in accordance with various embodiments of the present disclosure. With reference to FIG. 12, a method 1200 of providing ESD protection includes at step 1210 providing a loadboard assembly electrically connected to a plurality of input/output channels. At step 1220, a socket assembly is provided that is adaptable to accept a 3DIC, the socket assembly in contact with the loadboard assembly. At step 1230, a 3DIC package can be placed within the socket assembly. Upon such placement, voltage can be forced on ones of the plurality of input/output channels to slowly dissipate charges resident on the 3DIC package to thereby provide electrostatic discharge protection at step 1240. In some embodiments, the forced voltage is positive and the dissipated charges are negative. In some embodiments, the forced voltage is negative and the dissipated charges are positive. In some embodiments, steps 1210 through 1240 are performed before testing of the 3DIC package.

In some embodiments of the present subject matter, a system to avoid ESD to a 3DIC package can include a loadboard assembly electrically connected to a plurality of input/output channels, the loadboard assembly having a loadboard PCB and a plurality of ground pins. The system also includes a socket assembly adaptable to accept a 3DIC package, the socket assembly having a BGA electrically connected to respective ground pins and includes a substrate adjacent the BGA, contained in the socket assembly, and positioned on an opposing side than the ground pins. In some embodiments, the socket assembly further includes a metal layer therein for shielding the 3DIC package from charges on the loadboard PCB thereby avoiding inducement of charges on the 3DIC package. In some embodiments, this socket assembly comprises insulative portions between the plurality of ground pins and the metal layer to provide a shielding effect between the socket assembly and the 3DIC package. When the socket assembly accepts a 3DIC package, voltage is forced on ones of the plurality of input/output channels to slowly dissipate charges resident on the 3DIC package to provide electrostatic discharge protection. The forced channel can be a ground channel having a high resistance or a power channel having a high resistance. The 3DIC package can include an interposer, an array of control collapse chip connection bumps on one side of the interposer and connected to respective through silicon vias which are electrically connected to an array of ubumps on an opposing side of the interposer, the ubumps adaptable to provide an electrical connection between the substrate and the 3DIC package.

Some embodiments of the present subject matter provide a reusable probe card assembly having a grounding PCB electrically connected to a plurality of input/output channels, a probe card substrate adjacent the grounding PCB, a probe card head adjacent the probe card substrate and opposite the grounding PCB, and a plurality of probe card pins connected to the probe card head. The probe card substrate can include a conductive material and can mate with any type of probe card head. The conductive material can include materials such as, but not limited to, nickel alloys, copper alloys, aluminum, and combinations thereof. In some embodiments, the grounding PCB includes routing circuitry to short all signal traces to ground traces to disperse electrostatic discharge current.

Some embodiments of the present subject matter provide a reusable socket assembly having a grounding loadboard electrically connected to a plurality of input/output channels and a socket case adaptable to accept a 3DIC package. The socket case is adaptable to enclose a conductive plate, a socket base, and a plurality of pogo pins. The conductive plate includes a conductive material and can mate with any type of socket base. The conductive material can include materials such as, but not limited to, nickel alloys, copper alloys, aluminum, and combinations thereof. In some embodiments, the grounding loadboard includes routing circuitry to short all signal traces to ground traces to disperse electrostatic discharge current.

It is therefore an aspect of embodiments of the present subject matter to provide a co-designed 3DIC and test interface for ESD protection to provide a safe discharging path for the 3DIC to prevent ESD damage on the DUT and test interface. It is another aspect of embodiments of the present subject matter to provide a reusable dummy test interface to improve ESD protection capability by providing an enhanced ESD protection capability with extra test setup time. One aspect of some embodiments provides an ESD prevention test interface using metal shielding design on the test interface to avoid inducing charges on a respective 3DIC thereby preventing possible ESD events. A further aspect of embodiments of the present subject matter provides an efficient 3DIC ESD protection and prevention test operation flow employing the anti-ESD damage 3DIC test solutions described herein. Therefore, embodiments described herein provide advantageous 3DIC ESD protection solutions for a test interface to enhance test equipment lifetime and improve test quality, for prevention of inducement of charges on DUTs thereby ensuring no ESD damage to sensitive components thereon, and for an efficient ESD protection and prevention test operation flow to provide an overall testing ESD solution.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-12, a three dimensional integrated circuit electrostatic discharge protection and prevention test interface have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A system to provide electrostatic discharge protection to a wafer comprising:
    a probe card assembly electrically connected to a plurality of input/output channels, the probe card assembly comprising:
    a probe card printed circuit board (PCB),
    a probe card substrate adjacent the probe card PCB,
    a probe card head adjacent the probe card substrate and opposite the PCB, and
    a plurality of probe card pins connected to the probe card head; and
    a secondary assembly comprising an interposer electrically coupled to one or more wafers, each wafer comprising at least a device under test,
    wherein when the probe card pins couple probe pads on the wafer, voltage is forced on ones of the plurality of input/output channels to dissipate charges resident on the wafer to provide electrostatic discharge protection.

2. The system of claim 1, wherein the forced channel is selected from the group consisting of a ground channel having resistance and a power channel having resistance.

3. The system of claim 1, wherein the secondary assembly further comprises an array of control collapse chip connection bumps connected to respective through silicon vias which are electrically connected to an array of µbumps, the µbumps adaptable to provide an electrical connection between the probe card assembly and the devices under test.

4. The system of claim 1, wherein the probe card head further comprises a metal layer thereon for shielding the wafer from charges on the probe card PCB thereby avoiding inducement of charges on the wafer.

5. The system of claim 4, wherein the probe card head further comprises a metal layer thereon for shielding the wafer from charges on the probe card PCB thereby avoiding inducement of charges on the wafer.

6. The system of claim 1, wherein when the probe card pins couple probe pads on the wafer, first voltage is applied on at least one of the plurality of input/output channels and second voltage is then applied on the at least one of the plurality of input/output channels so as to dissipate charges resident on the wafer to provide electrostatic discharge protection.

7. The system of claim 6, wherein the first and second voltages are with a same magnitude but different signs.

8. The system of claim 1, wherein the PCB is a grounding PCB, and the probe card substrate includes a conductive material and can mate with any type of probe card head.

9. The system of claim 8, wherein the grounding PCB includes routing circuitry to short all signal traces to ground traces to disperse electrostatic discharge current.

10. A system to provide electrostatic discharge protection to a wafer comprising:
    a probe card assembly electrically connected to a plurality of input/output channels, the probe card assembly comprising:
    a probe card printed circuit board (PCB),
    a probe card substrate adjacent the probe card PCB,
    a probe card head adjacent the probe card substrate and opposite the PCB, and
    a plurality of probe card pins connected to the probe card head; and
    a secondary assembly comprising an interposer electrically coupled to one or more wafers, each wafer comprising at least a device under test,
    wherein when the probe card pins couple probe pads on the wafer, two voltages with a same magnitude but different signs are sequentially applied on at least one of the plurality of input/output channels to dissipate charges resident on the wafer to provide electrostatic discharge protection.

11. The system of claim 10, wherein the forced channel is selected from the group consisting of a ground channel having resistance and a power channel having resistance.

12. The system of claim 10, wherein the secondary assembly further comprises an array of control collapse chip connection bumps connected to respective through silicon vias which are electrically connected to an array of µbumps, the µbumps adaptable to provide an electrical connection between the probe card assembly and the devices under test.

13. The system of claim 10, wherein the probe card head further comprises a metal layer thereon for shielding the wafer from charges on the probe card PCB thereby avoiding inducement of charges on the wafer.

14. The system of claim 13, wherein the probe card head further comprises a metal layer thereon for shielding the wafer from charges on the probe card PCB thereby avoiding inducement of charges on the wafer.

15. The system of claim 10, wherein the PCB is a grounding PCB, and the probe card substrate includes a conductive material and can mate with any type of probe card head.

16. The system of claim 15, wherein the grounding PCB includes routing circuitry to short all signal traces to ground traces to disperse electrostatic discharge current.

17. A probe card assembly comprising:
- a grounding printed circuit board (PCB) electrically connected to a plurality of input/output channels;
- a probe card substrate adjacent the grounding PCB;
- a probe card head adjacent the probe card substrate and opposite the grounding PCB; and
- a plurality of probe card pins connected to the probe card head,
- wherein the plurality of probe card pins are configured to couple a wafer comprising at least a device under test, and wherein when the plurality of probe card pins couple the wafer, voltage is forced on ones of the plurality of input/output channels to dissipate charges resident on the wafer to provide electrostatic discharge protection, and
- wherein the probe card substrate includes a conductive material and can mate with any type of probe card head.

18. The probe card assembly of claim 17, wherein the conductive material is selected from the group consisting of nickel alloys, copper alloys, aluminum, and combinations thereof.

19. The probe card assembly of claim 17, wherein the grounding PCB includes routing circuitry to short all signal traces to ground traces to disperse electrostatic discharge current.

20. The probe card assembly of claim 17, wherein the probe card head further comprises a metal layer thereon for shielding the wafer from charges on the probe card PCB thereby avoiding inducement of charges on the wafer.

\* \* \* \* \*